(12) United States Patent
Hansen

(10) Patent No.: US 7,496,882 B2
(45) Date of Patent: Feb. 24, 2009

(54) OPTIMIZATION TO AVOID SIDELOBE PRINTING

(75) Inventor: Steven Hansen, Phoenix, AZ (US)

(73) Assignee: ASML Netherlands B.V., Veldhoven (NL)

( * ) Notice: Subject to any disclaimer, the term of this patent is extended or adjusted under 35 U.S.C. 154(b) by 819 days.

(21) Appl. No.: 11/019,128

(22) Filed: Dec. 22, 2004

(65) Prior Publication Data

US 2006/0134529 A1    Jun. 22, 2006

(51) Int. Cl.
*G06F 17/50* (2006.01)
*G06F 19/00* (2006.01)
*G03F 1/00* (2006.01)
*G06K 9/00* (2006.01)

(52) U.S. Cl. .............. 716/21; 430/5; 700/121; 382/144

(58) Field of Classification Search ............. 716/19–21; 700/121; 430/5; 382/144
See application file for complete search history.

(56) References Cited

U.S. PATENT DOCUMENTS

| | | | | |
|---|---|---|---|---|
| 5,700,606 | A * | 12/1997 | Kobayashi et al. ............. | 430/5 |
| 6,020,988 | A * | 2/2000 | Deliwala et al. ............. | 359/276 |
| 6,248,988 | B1 * | 6/2001 | Krantz ..................... | 250/201.3 |
| 6,291,113 | B1 * | 9/2001 | Spence .................... | 430/5 |
| 6,329,112 | B1 * | 12/2001 | Fukuda et al. .............. | 430/30 |
| 6,418,553 | B1 * | 7/2002 | Yamada et al. .............. | 716/21 |
| 6,593,033 | B1 * | 7/2003 | Ma et al. .................. | 430/5 |
| 6,680,150 | B2 * | 1/2004 | Blatchford et al. ........... | 430/5 |
| 6,696,208 | B2 | 2/2004 | Czech et al. | |
| 6,905,621 | B2 * | 6/2005 | Ho et al. .................. | 216/47 |
| 2004/0069745 | A1 * | 4/2004 | Ho et al. .................. | 216/41 |
| 2005/0273753 | A1 * | 12/2005 | Sezginer .................. | 716/21 |
| 2006/0256311 | A1 * | 11/2006 | Hansen et al. .............. | 355/67 |

OTHER PUBLICATIONS

Bruce W. Smith, "Forbidden Pitch or Duty-Free: Revealing the Causes of Across-Pitch Imaging Differences," Microelectronic Eng. Dept, Rochester Institute of Technology (Rochester, NY), 9 pages.
Rieger et al., "Layout Design Methodologies for Sub-Wavelength Manufacturing ," DAC 2001, Las Vegas, Nevada ( Jun. 18-22, 2001), 4 pages.
Rieger et al., "Layout Design Methodologies for Sub-Wavelength Manufacturing," Avant! Corporation, 20 pages.

* cited by examiner

*Primary Examiner*—Stacy A Whitmore
(74) *Attorney, Agent, or Firm*—Pillsbury Winthrop Shaw Pittman LLP

(57) ABSTRACT

A method for configuring the optical transfer of a mask pattern onto a substrate using a lithographic apparatus is presented. In an embodiment of the invention, the method includes calculating a size of a printed sidelobe to be generated as a result of optical transfer of the mask pattern onto the substrate; and determining a plurality of lithographic parameters for optical transfer of the mask pattern onto the substrate that yields an optimization of a high latitude for the mask pattern and a small printed sidelobe size.

43 Claims, 6 Drawing Sheets

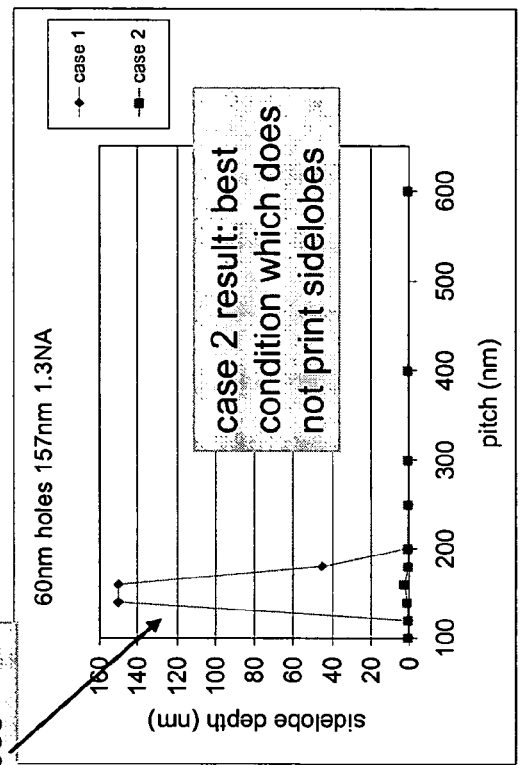
FIG. 6c
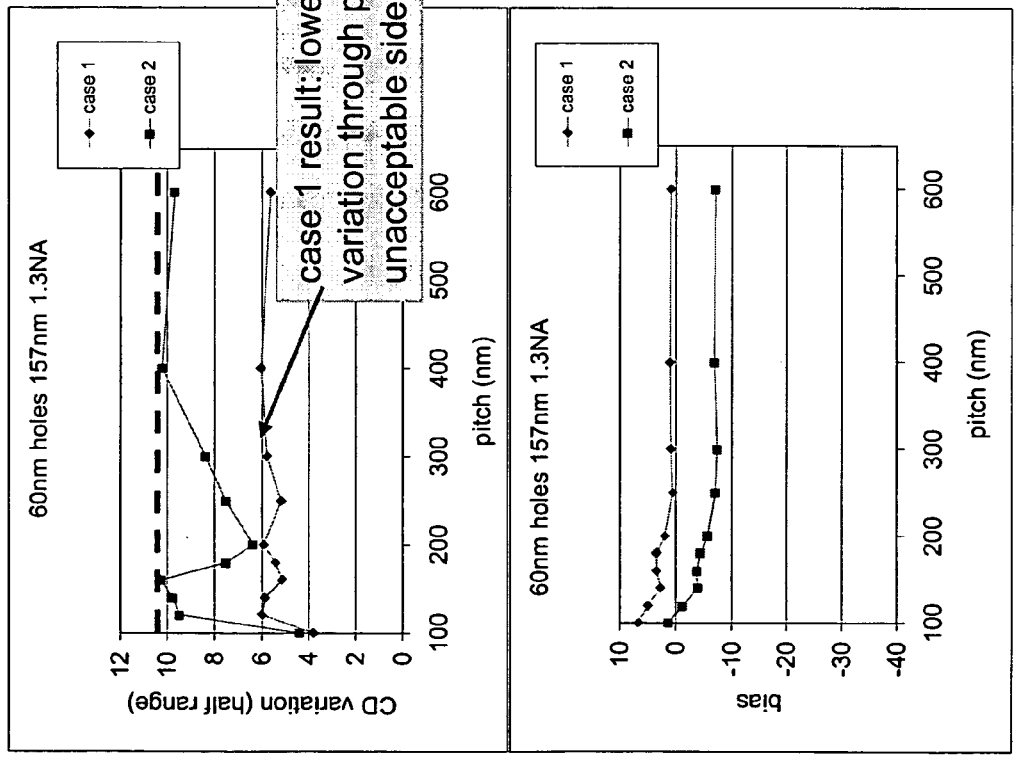
FIG. 6a
FIG. 6b

OPTIMIZATION TO AVOID SIDELOBE PRINTING

FIELD

This invention relates to a lithographic apparatus and a lithographic method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Conventional lithographic apparatus include so-called steppers, in which each target portion is irradiated by exposing an entire pattern onto the target portion at once, and so-called scanners, in which each target portion is irradiated by scanning the pattern through the beam of radiation in a given direction (the "scanning"-direction) while synchronously scanning the substrate parallel or anti-parallel to this direction.

As the semiconductor industry moves into the deep submicron regime, the resolution limit of currently available lithographic techniques is being reached due to a decrease in the depth of focus, difficulty in the design of projection systems and complexities in the projection system fabrication technology. In order to address this issue, there have been continued endeavors to develop resolution enhancement techniques.

One of the resolution enhancement techniques that has been extensively used in small geometry semiconductor manufacturing to achieve process latitude and pattern resolution greater than that achievable using conventional binary masks is the phase shift mask. In today's rapidly advancing semiconductor manufacturing industry, which includes increasingly high levels of integration and correspondingly small feature sizes, the use of phase shift masks is important in the execution of state-of-the-art fabrication processes. So called attenuated phase shift masks (Att-PSM) are fabricated by replacing the opaque part of a conventional mask with a halftone film—one that is partially transmissive. The transmissivity of such a halftone film is generally on the order of about 10% transmission. The halftone film is chosen to desirably shift the phase of the radiation it transmits by 180 degrees. The radiation which passes through the clear area of the phase shift mask, in contrast, is not phase shifted. In this manner, destructive interference occurs between some diffracted waves which can be beneficial for imaging.

A main problem with Att-PSMs, however, is the potential printing of sidelobes, which are unwanted images in the final pattern caused by constructive interference between adjacent clear features in the mask pattern when the adjacent clear features are closely spaced and are separated by a distance on the order of the radiation wavelength. An example of sidelobe formation using a conventional lithographic apparatus is shown in FIGS. 1a-d.

FIG. 1a is a schematic representation of a conventional lithographic apparatus 100 that includes a projection system 105 and a mask 110, which is used to selectively illuminate portions of a substrate 115 at least partially covered with a radiation sensitive material 120.

The mask 110 includes a radiation transmissive substrate 125, with a partially-transmissive phase-shifting material 130 on regions of the substrate 125. The phase-shifting material is a material which absorbs most of the radiation passing therethrough, and shifts the phase of the radiation which it does allow to pass therethrough. Radiation passing through the phase-shifting material in phase-shifting regions 130 is shifted in phase by approximately 180 degrees, thereby making it opposite in phase in comparison with radiation that passes through regions of the mask 110 which do not have a coating of phase-shifting material 130, such as the radiation transmissive or open region 140 shown in FIG. 1a. Radiation 145 passes through the mask 110 and exposes the radiation sensitive material 120 on the substrate 115.

The transmissivity of the mask 110 is plotted in FIG. 1b, wherein the transmissivity of the open region 140 is represented as a positive value 150 and the transmissivity of the regions with phase-shifting material 130 is represented as a negative value 155. The negative value for the transmissivity for regions of the mask 110 covered by the phase-shifting material 130 indicates the interference between radiation passing through open region 140 and radiation passing through phase-shifting regions.

The electric field intensity from the radiation 145 reaching the radiation sensitive material 120 is illustrated in FIG. 1c, the electric field intensity from the open region 140 being shown by a curve 160, and the electric field intensity from the phase-shifting regions being shown by a curve 165. The open region curve 160 is generally positive, with sinusoidal end portions 170 away from the open region 160, the end portions having asymptotically-reducing amplitude. The phase-shifting region curve 165 has a negative electric field intensity, the negative value being constant far from the open region 160, and reducing to zero in the vicinity of the transition between the phase-shifting regions and the open region 140.

The curves 160 and 165 are summed and squared to give the radiation exposure in the radiation sensitive material 120, as illustrated in FIG. 1d. The radiation exposure profile has a main peak 175 corresponding to the center of the open region 140. The radiation intensity drops off from the main peak to main troughs 180 on either side of the main peak 175. Moving further away from the main peak 175 are secondary peaks 185 and tertiary peaks 190. Far away from the main peak 175 is a constant exposure 195 which corresponds to the transmission of the attenuating material. A printing threshold intensity level, shown in FIG. 1d as a dashed line 196, is the minimum intensity level required for sufficient exposure of the radiation sensitive material 120 to eventually result in printing on the substrate 115. As illustrated, the intensity level results in printing a feature having a width 197 which is less than the width of the open region 140.

In order to avoid printing the secondary peaks 185 and tertiary peaks 190 on the substrate, the threshold 196 must be higher than the level of these peaks. However, even though this condition is satisfied, a secondary peak may combine with a secondary or tertiary peak from another feature (corresponding to another open region on the mask 110) to locally exceed the printing threshold. These undesired areas on the substrate where the printing radiation intensity exceeds the threshold intensity are referred to as "sidelobes".

Sidelobes appear typically as spurious windows or ring structures in dense patterns, and are highly sensitive to pattern details (e.g. pitch) and optical conditions (e.g. source shape and numerical aperture NA). Sidelobe printing is most problematic for hole patterns with pitches near $1.2 * \lambda/NA$ (where λ is the radiation wavelength and NA is the numerical aperture of lithographic apparatus), with small pattern bias (i.e. relatively high printing dose) and where high transmission masks are used. Sidelobe printing also may be problematic for 193 nm lithography, where current radiation sensitive materials may not have sufficient surface inhibition to prevent sidelobe formation. Sidelobe printing may drastically affect device manufacturing yield because the unwanted additional features in the pattern may be transferred into the substrate.

SUMMARY

An embodiment of the invention includes a method for configuring the optical transfer of a mask pattern onto a substrate using a lithographic apparatus. In an embodiment of the invention, the method includes calculating a size of a printed sidelobe to be generated as a result of optical transfer of the mask pattern onto the substrate; and determining a plurality of lithographic parameters for optical transfer of the mask pattern onto the substrate that yields an optimization of a high latitude for the mask pattern and a small printed sidelobe size.

In another embodiment of the invention, there is provided a computer program product having machine-executable instructions, the instructions executable by a machine to perform a method for configuring the optical transfer of a mask pattern onto a substrate using a lithographic apparatus. The method includes calculating a size of a printed sidelobe to be generated as a result of optical transfer of the mask pattern onto the substrate; and determining a plurality of lithographic parameters for optical transfer of the mask pattern onto the substrate that yields an optimization of a high latitude for the mask pattern and a small printed sidelobe size.

In yet another embodiment of the invention, there is provided a lithographic apparatus including a support structure configured to support a patterning device which can be used to pattern a beam of radiation according to a desired pattern; a substrate table configured to hold a substrate; a projection system configured to project the patterned beam onto a target portion of the substrate; a processor configured to calculate a size of a printed sidelobe to be generated as a result of optical transfer of the mask pattern onto the substrate, to determine a plurality of lithographic parameters for optical transfer of the mask pattern onto the substrate that yields an optimization of a high latitude for the mask pattern and a small printed sidelobe size, and to determine an illumination shape based on the determined plurality of lithographic parameters; and a selectably variable beam controller that is adapted to modify a cross-sectional intensity distribution in the beam of radiation, before the beam of radiation reaches the patterning device, in accordance with the illumination shape determined by the processor.

In yet another embodiment of the invention, there is provided a computer program product having machine-executable instructions, the instructions being executable by a machine to perform a method for configuring the optical transfer of a mask pattern onto a substrate using a lithographic apparatus. The method includes instructing a simulator to determine a size of a printed sidelobe to be generated as a result of optical transfer of the mask pattern onto the substrate, the optical transfer of the mask pattern being calculated with a simulation model of the simulator; and instructing the simulator to iteratively run the simulation model to determine the best conditions for obtaining a high latitude for the mask pattern with a small printed sidelobe size.

In an embodiment of the invention, there is provided a method for configuring the optical transfer of a mask pattern onto a substrate using a lithographic apparatus, the method including determining an intensity of radiation associated with a sidelobe that is generated as a result of the optical transfer of the mask pattern onto the substrate, and determining a plurality of lithographic parameters for optical transfer of the mask pattern onto the substrate that yields an optimization of a high latitude for the mask pattern and a sidelobe intensity associated with said sidelobe below a threshold printing value.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6a shows the half range critical dimension (CD) variation of a 60 nm hole square grid pattern, exposed with the illumination shapes of case 1 and case 2 using 157 nm radiation and a 1.3 NA lithographic apparatus projection system, as a function of pitch;

FIG. 6b shows the mask bias variation as a function of pitch for the illumination shapes of case 1 and case 2 at their respective optimum doses; and FIG. 6c shows the variation of sidelobe depth with the 60 nm hole square grid pattern for the illumination shapes of case 1 and case 2 as a function of pitch.

DETAILED DESCRIPTION

Figure 1B:
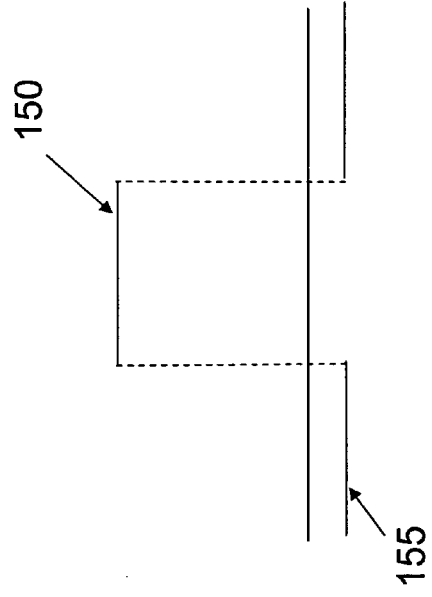
FIGS. 1a-d illustrate an example of sidelobe formation using a conventional lithographic apparatus.
Figure 1C:
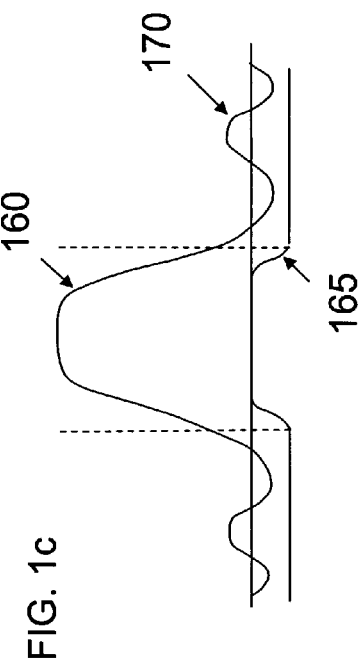
Figure 1A:
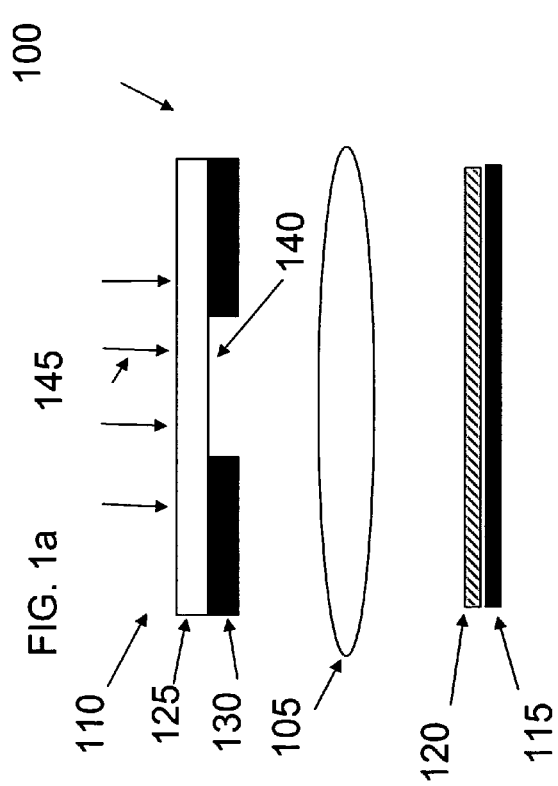
Figure 1D:
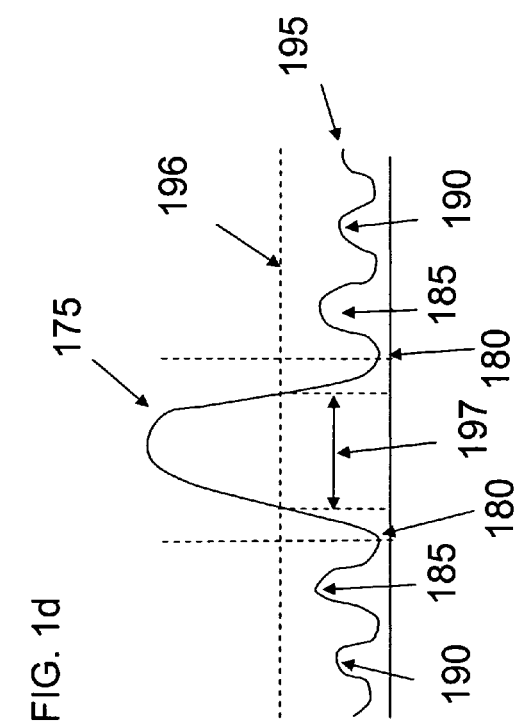
Figure 2:
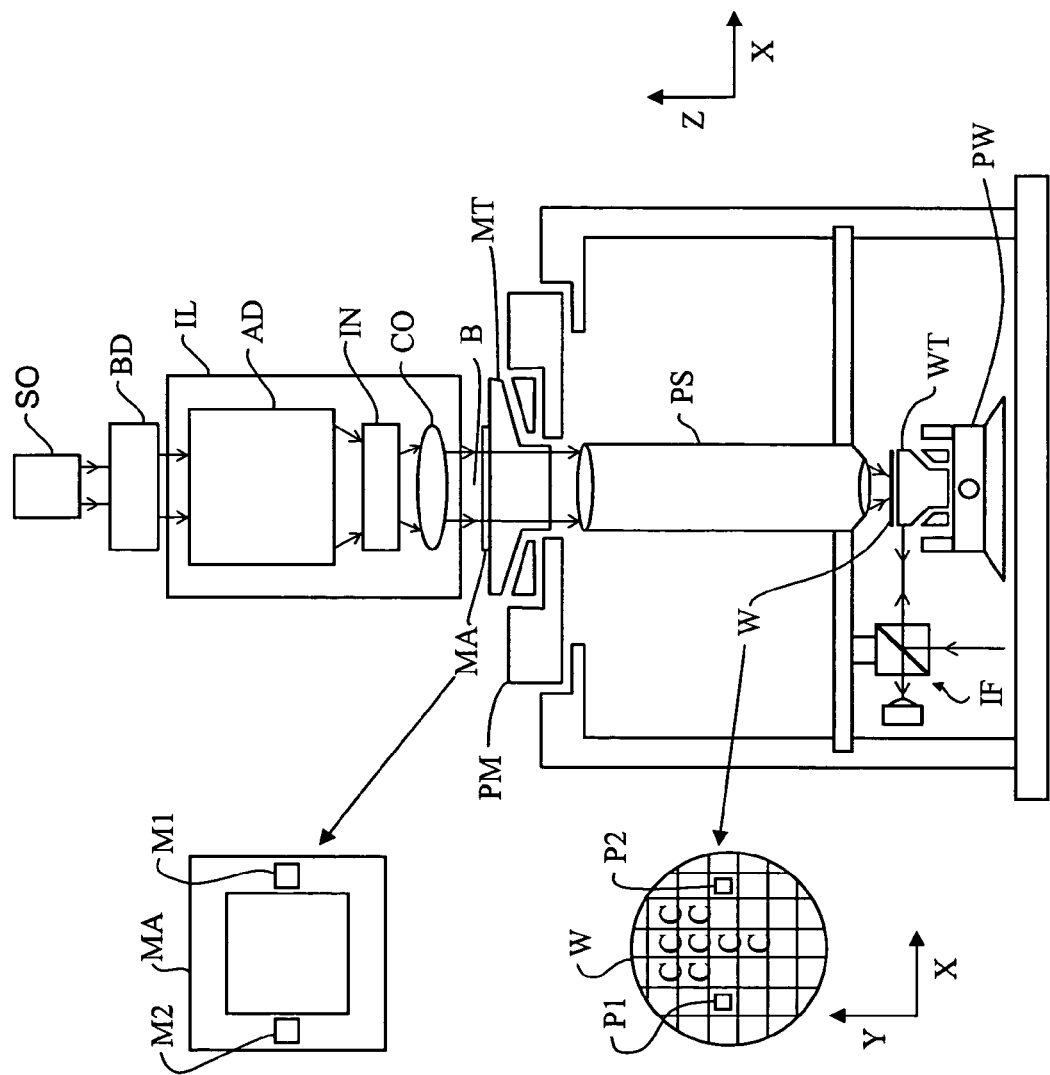
FIG. 2 depicts a lithographic apparatus in accordance with an embodiment of the invention.

FIG. 2 schematically depicts a lithographic apparatus according to an embodiment of the invention. The apparatus includes an illumination system (illuminator) IL adapted to condition a beam B of radiation (e.g. UV radiation) and a support structure (e.g. a mask table) MT configured to hold a patterning device (e.g. a mask) MA and connected to a first positioning device PM configured to accurately position the patterning device with respect to the projection system PS, ("projection lens"). The apparatus also includes a substrate table (e.g. a wafer table) WT configured to hold a substrate (e.g. a resist-coated wafer) W and connected to a second positioning device PW configured to accurately position the substrate with respect to the projection system PS. The apparatus also includes a projection system (e.g. a refractive projection lens) PS adapted to image a pattern imparted to the beam B by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to below).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD, including for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may include an adjusting device AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation B.

The beam of radiation B is incident on the mask MA, which is held on the mask table MT. Having traversed the mask MA, the beam of radiation B passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam B. Similarly, the first positioning device PM and another position sensor (which is not explicitly depicted in FIG. 2) can be used to accurately position the mask MA with respect to the path of the beam B, e.g. after mechanical retrieval from a mask library, or during a scan. In general, movement of the tables MT and WT will be realized with the aid of a long-stroke module (coarse positioning) and a short-stroke module (fine positioning), which form part of one or both of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus may be used in the following preferred modes:

1. In step mode, the mask table MT and the substrate table WT are kept essentially stationary, while an entire pattern imparted to the beam of radiation is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations of the above described modes of use or entirely different modes of use may also be employed.

Figure 3:
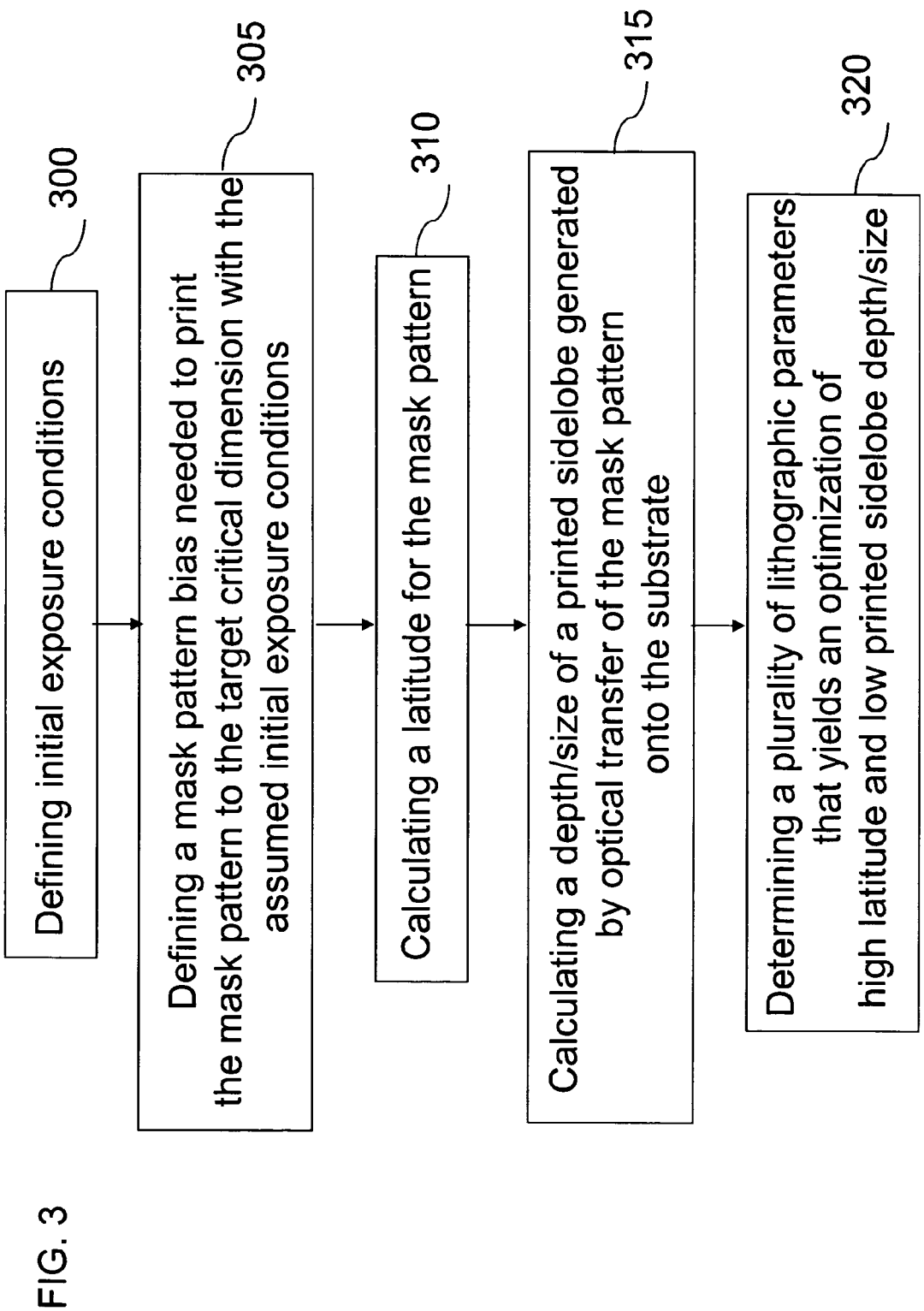
FIG. 3 represents a flowchart for optimizing a lithographic process in accordance with an embodiment of the invention.

FIG. 3 illustrates a method for configuring the optical transfer of a mask pattern in accordance with an embodiment of the invention.

The method begins at step 300 where initial exposure conditions are defined. The exposure conditions may include one or more of the following parameters: the target size (e.g., critical dimension) of the mask pattern, the target pitch range, the parameterized illumination shape, the numerical aperture of the projection system and the exposure dose. The initial exposure parameters can be selected based on a previous lithographic simulation or on a past experiment that has demonstrated satisfactory results for a similar mask pattern. Alternatively, the initial exposure parameters may be determined with a new lithographic simulation.

Lithographic simulations may be performed using different models. Examples of simulation models and methods to optimize a parameterized illumination shape may be found for example in U.S. patent application Ser. No. 10/361,831, filed on Feb. 11, 2003, entitled "Method for Optimizing an Illumination Source Using Full Resist Simulation and Process Window Metric", and U.S. patent application Ser. No. 10/716,439, filed on Nov. 20, 2003, entitled "Lithographic Apparatus and Method for Optimizing an Illumination Source Using Isofocal Compensation". The contents of these two applications are incorporated herein in their entirety by reference.

In an embodiment of the invention, a lithographic simulation may be performed with an aerial image model in order to determine the incident radiation energy distribution onto the radiation sensitive material (resist). Calculation of the aerial image may be done either in the scalar or vector form of the Fourier optics. Characteristics of the lithographic apparatus and process, like the numerical aperture (NA) or the specific mask pattern, may be entered as input parameters for the simulation. In practice, a simulation may be carried out with the aid of a commercially available simulator such as Prolith™, Solid-C™, Lithocruiser™ or the like.

The calculated image may then be evaluated versus one or more criteria to judge whether the image has appropriate optical qualities to successfully print the desired feature in resist on the substrate. The aerial image can be analyzed, through a focus range, to provide estimates of the exposure latitude and depth of focus and the procedure can be performed iteratively to arrive at the optimal optical conditions. Practically, the quality of the aerial image may be determined by using a contrast or normalized aerial image log-slope (NILS) metric (normalized to the feature size). This value corresponds to the slope of the image intensity (or aerial image).

Relevant parameters to perform the aerial image simulation may include the distance from the focal plane of the Gaussian image plane, meaning the distance to the plane where the best plane of focus exists, as determined by geometrical ray optics, or the center wavelength of the quasi-monochromatic radiation source. The parameters may also include a measure of degree of spatial partial coherence of the illumination system, the numerical aperture of the projection system exposing the substrate, the aberrations of the optical system and a description of the spatial transmission function representing the mask pattern.

In another embodiment of the invention, a lithographic simulation may be performed with a resist model. In an implementation, the resist model may take into account, in the calculation of the critical dimension (or size) and its variation with variables such as dose/exposure energy and focus, the resist exposure, the resist baking and the resist developing. Likewise, the resist model may take into account, in an embodiment of the invention, a nonplanar topography and vector effects. The vector effects refer to the fact that an electromagnetic wave propagates obliquely when a high numerical aperture is used. Although vector effects can be accounted for when calculating the aerial image, a calculation of the vector effects in gas (e.g., in air) may greatly overestimate the contrast loss obtained on the substrate because the incident rays tend to be straightened when they propagate in the resist because of the resist's higher refractive index. Therefore, a resist model with a rigorous electromagnetic calculation may be desirable to accurately determine the actual experimental response.

Additional models like a lumped parameter model or a variable threshold resist model may also be used in other embodiments of the invention. It will be appreciated that the simulation model is selected because it matches to experimental data.

Still referring to FIG. 3, the method then proceeds to step 305 where a mask pattern bias is determined for the assumed initial exposure conditions (e.g., parameterized illumination shape and dose). Mask biasing is done in order for the features of the exposed mask pattern to more match the nominal or desired feature size (e.g., target critical dimension) for a selected dose or threshold.

In the present invention, the candidate source shape (step 300) and mask bias (step 305) are selected and tested in the simulator and then iteratively adjusted to get a high process latitude with acceptable sidelobing. A high process latitude may correspond to a depth of focus greater than about, e.g. 0.3 μm, or to a half range critical dimension variation of the mask pattern lower than about 20%. More generally, a high process latitude may correspond to a lithographic process that prints the mask pattern within predetermined specifications, regardless of variations of lithographic parameters (e.g. numerical aperture, temperature, pressure, focus, alignment errors, ...) so long as these variations are within a determined range.

Next, the method proceeds to step 310 where the latitude for the mask pattern is calculated. In an embodiment of the invention, a critical dimension uniformity analysis may be used to calculate the latitude for the initial trial condition. Critical dimension uniformity is a measure of the calculated feature sizes vs. the targeted sizes over a process variation range. A critical dimension uniformity analysis may be conducted by first calculating the critical dimension variation of the calculated printed pattern due to several parameters. The parameters are varied over a predetermined range to simulate the fluctuations of the lithographic process. Examples of parameters that can be used in a critical dimension uniformity analysis include, for example, focus, dose, lens aberrations, flare level, variation of pattern density and mask critical dimension range.

Subsequent to calculating a plurality of critical dimension variations (each of them being obtained by varying the value of the parameters over their predetermined range), the overall critical dimension variation induced by all of the parameters is determined. This can be done, for example, by calculating the quadratic sum of the critical dimension variations induced by each individual process variation. Additional information about critical dimension uniformity analysis can be gleaned, for example, from U.S. patent application Ser. No. 10/773, 397, filed on Feb. 9, 2004, entitled "Lithographic Apparatus and Method for Optimizing an Illumination Source Using Photolithographic Simulations". The content of that application is incorporated herein by reference in its entirety.

The method then proceeds to step 315, where a depth or size of a printed sidelobe generated by optical transfer of the mask pattern onto the radiation sensitive material coated on the substrate is calculated. Referring back to FIGS. 1a-1d, sidelobe formation may be detected by spatially summing the intensity profiles of the imaged pattern to determine whether a secondary (or higher order) intensity peak of a first feature of the mask pattern could combine with a secondary or tertiary peak from another feature of the mask pattern to locally exceed the printing threshold. If so, a resist simulation, or an analysis of the projected image may then be performed to extract the depth or size of the sidelobe.

It will be appreciated that a qualitative analysis of sidelobe formation may be used in another embodiment of the invention. For example, the intensity profile of the aerial image of the pattern may be compared to the threshold printing value to determine whether a sidelobe will print.

Then, the method proceeds to step 320 where a calculation is performed to determine a plurality of lithographic parameters that yields an optimization of high latitude and low printed sidelobe depth or size. The calculation can be carried out using an iterative fitting algorithm that cycles through, for example, the initial lithographic parameters defined in step 300 to find exposure conditions giving the lowest critical dimension variation and lowest sidelobe depth or size. In an embodiment of the invention, the minimization calculation may be performed using Simplex and/or Levenberg-Marquardt convergence calculations. These calculations minimize the selected parameters (e.g., critical dimension variation and sidelobe depth) until convergence is achieved, i.e. a minimum is found. It will be appreciated that additional convergence routines may be used in other embodiments of the invention. The exposure conditions determined from the minimization may then be used in a lithographic process using the mask pattern to provide good critical dimension uniformity with no sidelobes or small sidelobes.

A small sidelobe size may correspond to a sidelobe that is formed with, or has, an associated radiation intensity lower than an intensity printing threshold that is used to print (i.e. that is associated with) the mask pattern. In such a case, the sidelobe will not print on the substrate. That case corresponds to the situation where a secondary (or higher order) intensity peak of a first feature of the mask pattern combines with a secondary or tertiary peak from another feature of the mask pattern but does not locally exceed the printing threshold. In another embodiment of the invention, a small sidelobe size may correspond to a sidelobe width that is smaller than the smallest distance between two features of the mask pattern. In such a case, although the sidelobe may print on the substrate, these two features will not be bridged by the sidelobe, thereby preventing, e.g., short-circuits between these two features during operation of the device. In yet another embodiment of the invention, a small sidelobe size may include a sidelobe having a depth lower than about 150 nm or a width that is substantially zero.

It will be appreciated that the process of step 320 may be optimized in a similar manner if a qualitative analysis of sidelobe formation is used. For example, the lithographic parameters may be determined using an iterative fitting algorithm that cycles through the initial lithographic parameters to find exposure conditions giving the lowest critical dimension variation and sidelobe intensity below the printing threshold.

Figure 4:
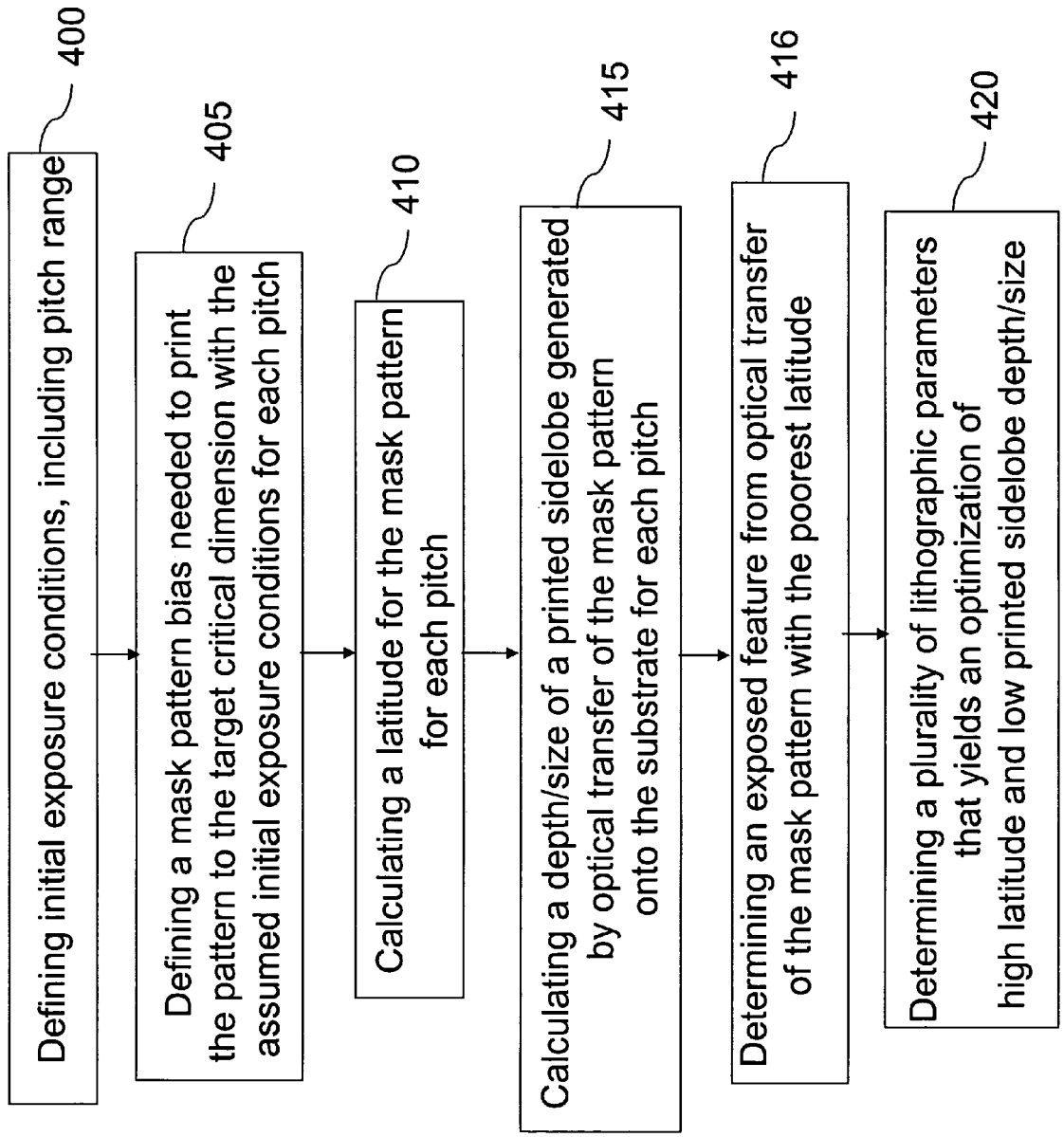
FIG. 4 represents a flowchart for optimizing a lithographic process in accordance with an embodiment of the invention.

FIG. 4 represents a flowchart for a method for configuring the optical transfer of a mask pattern in accordance with another embodiment of the invention. In this embodiment of the invention, the method makes certain calculations through a pitch range.

The method begins at step 400 where initial exposure conditions, including the pitch range of the mask pattern, are determined. Similarly to the embodiments shown in FIG. 3, the exposure conditions may include one or more of the following additional parameters: the target size (e.g., critical dimension) of the mask pattern, the parameterized illumination shape, the numerical aperture of the projection system and the exposure dose. The initial exposure parameters can be selected based on a previous lithographic simulation, a past experiment or a newly calculated simulation.

The method then proceeds to step 405 where a mask pattern bias for printing the mask pattern to the target size (e.g., critical dimension) with the assumed initial exposure conditions (e.g., parameterized illumination shape and size) is calculated for a selected pitch in the pitch range. Then, the latitude of the mask pattern is determined for each pitch (step 410) using, for example, a critical dimension uniformity analysis (as discussed above), and the printed sidelobe depth generated by the optical transfer of the mask pattern is calculated in step 415, for each pitch. Calculation of the sidelobe depth can be performed in a similar manner as in the embodiment shown in FIG. 3. That is, sidelobe formation may be detected by spatially summing the intensity profiles of the mask pattern to determine whether a secondary (or higher order) intensity peak of a first feature of the mask pattern could combine with a secondary or tertiary peak from another feature of the mask pattern to locally exceed the printing threshold. If so, a resist simulation, or an analysis of the projected image may then be performed to extract the depth or a size of the sidelobe.

Subsequent to calculating a sidelobe depth or size for each pitch, an exposed feature (e.g, a hole) from optical transfer of the mask pattern (and its associated pitch) having the poorest latitude (e.g., producing the highest critical dimension variation) and/or sidelobe depth or size is identified (step 416) and calculation is performed to find conditions giving high latitude (e.g., those minimizing critical dimension variation) and low sidelobe depth or size. Likewise, Simplex and/or Levenberg-Marquardt convergence calculations may be used to minimize the selected parameters (e.g., critical dimension variation and sidelobe depth) until convergence is achieved.

Figure 5:
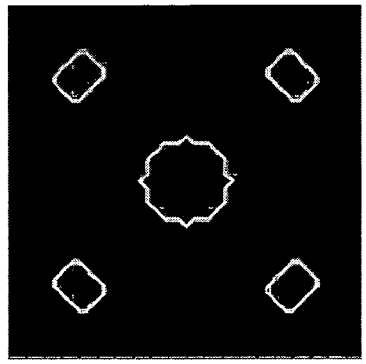
FIG. 5 is a schematic representation of two illumination shapes. Case 1 corresponds to an illumination shape with a central pole of 0.24 radius and a qudrupole illumination having a 0.947 outer radius, a 0.748 inner radius and a 17.1° angular radius. Case 2 corresponds to an illumination shape with a central pole of 0.29 radius and a qudrupole illumination having a 0.999 outer radius, a 0.700 inner radius and a 22.2° angular radius. The illumination shape of case 2 has been optimized with the method shown in FIG. 4.
Figure 5:
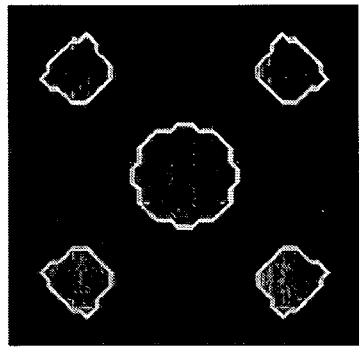

Referring now to FIG. 5, a first illumination shape (case 1) is shown that is optimized to give minimum critical dimension variations for selected pitches in the 100-600 nm range (without consideration of sidelobe printing) and a second illumination shape (case 2) is shown that is optimized in accordance with the embodiment of the invention represented in FIG. 4. In cases 1 and 2, the global bias has also been optimized to give minimum CD variation for selected pitches in the 100-600 nm range. The calculated biases for cases 1 and 2 are given in FIG. 6b. Table 1 shows the different exposure parameters and their associated ranges that have been used to determine the illumination shapes of case 1 and case 2. The mask is a 6% attenuated phase shift mask. It will be appreciated that additional parameters and/or ranges of variation could be used in other embodiments of the invention.

TABLE 1

| Mask Pattern (nm) | Pitch Range (nm) | Radiation (nm) | Numerical Aperture | Focus Range (μm) | Dose Range (%) | Mask Size Variation (nm) |
| --- | --- | --- | --- | --- | --- | --- |
| 60 (holes - square grid array) | 100-600 | 157 | 1.3 | 0.15 | 1 | 2 |

In the second scenario (case 2), the global bias and the illumination shape are also optimized to give minimum critical dimension variations for selected pitches in the 100-600 nm.

Optimization of the illumination shape with the method shown in FIG. 4 (step 415) indicated sidelobe formation in the pitch range around 140 nm. The metric was then calculated (step 420) to minimize critical dimension variations of the hole square grid and sidelobe depth for that pitch. Because it is desirable to have high latitude against printing sidelobes, the optimization procedure raised the applied dose 10% above the nominal value when calculating the printed hole depth. By rejecting conditions which sidelobe under this more severe condition, sidelobes should definitely be eliminated at the nominal dose.

In case 1, optimization of the lithographic process provides an illumination shape having a sigma=0.24 on-axis illumination plus an off-axis illumination component. The off-axis illumination is a quadrupole type illumination having a 0.947 outer radius, a 0.748 inner radius and a 17.1° opening angle. For the assumed resist modeling and processing conditions the optimized exposure dose is 62.6 mJ/cm$^2$ which then defines the mask biases needed to print the target CDs. In case 2, optimization of the lithographic process provides an illumination shape having a sigma=0.29 on-axis illumination and a quadrupole off-axis illumination having a 0.999 outer radius, a 0.700 inner radius and an opening angle of 22.2°. The optimized exposure dose is 41.7 mJ/cm$^2$. The inner and outer radii of the poles are given relative to the full aperture of the illuminator (with 1 corresponding to a full aperture).

It will be appreciated that creation of these illumination shapes can be done with conventional beam shapers. U.S. Pat. No. 6,452,662 discloses, for example, a multimode generating element that could be used to generate the illumination shapes of case 1 and case 2. The content of that application is incorporated herein in its entirety by reference. The multipole generating element, disclosed in that application, includes four triangular blades insertable into the beam path at the pupil plane of the illumination system. This multimode generating element enables continuously variable quadrupole illumination modes to be produced. In another embodiment of the invention, a metal aperture plate filter could be used to create the desired illumination shape.

Referring now to FIG. 6a, the half range critical dimension variation of the 60 nm hole square grid as a function of pitch for case 1 and case 2 is depicted. The simulation results indicate that the optimization is satisfactory for both cases as the half range critical dimension variation is within the acceptable range of variation (represented by the dashed line) regardless of the pitch.

FIG. 6b shows the the calculated biases for case 1 and case 2 as a function of pitch. The definition of bias used here is: bias=CD(printed hole)–CD(hole on mask at 1X). Case 2 has a negative bias through pitch, mainly due to the calculated lower optimal dose, which is favorable for sidelobe avoidance.

Referring now to FIG. 6c, the sidelobe depth as a function of pitch for case 1 and case 2 is depicted. The simulation results show that sidelobe formation occurs for case 1 in the 130-180 nm pitch range. As a result, device failure would likely occur where the pattern actually exposed onto a substrate. By contrast, case 2 does not show any sidelobe printing regardless of the pitch. These results show that it is desirable to account for sidelobe formation in the optimization of the lithographic process and it is clear that optimization including the sidelobe avoidance constraint results in a significantly different operating point for dose, bias, and source shape.

While one or more embodiments described herein employ holes through pitch with fixed NA, the concepts and embodiments herein may be extended to, for example, any fixed hole pattern or complex pattern that may exhibit sidelobes.

It will be appreciated that the different acts involved in optimizing the optical transfer of the mask pattern onto the substrate may be executed according to machine executable instructions. These machine executable instructions may be embedded in a data storage medium, e.g. of a control unit of the lithographic apparatus. The control unit may include a processor that is configured to control the adjusting device AM and to modify the cross-sectional intensity distribution in the beam exiting the illumination system IL.

In an embodiment of the invention, the different machine executable instructions may be embedded in a computer product which can be used in conjunction with a simulation software, such as Prolith™, Solid-C™, Lithocruiser™ or the like. That is, the computer product can be configured to provide the simulation software with a plurality of initial lithographic parameters, and to instruct the simulation software to calculate an image of the mask pattern transferred on the resist and a size or depth of a sidelobe printed on the resist. The computer product may then be configured to output the depth or size of the sidelobe from the simulator and to iterate through the plurality of initial parameters to determine the best conditions for obtaining the desired pattern with low printed sidelobe depth.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic apparatus, for example, between the mask and a first element of the projection system. Immersion techniques are well known in the art for increasing the numerical aperture of projection systems.

The methods described herein may be implemented as software, hardware or a combination. In an embodiment, there is provided a computer program comprising a program code that, when executed on a computer system, instructs the computer system to perform any or all of the methods described herein.

While specific embodiments of the invention have been described above, it will be appreciated that the invention may be practiced otherwise than as described. The description is not intended to limit the invention.

What is claimed is:

1. A method for configuring the optical transfer of a patterning device pattern onto a substrate using a lithographic apparatus, the method comprising:
   selecting a patterning device pattern bias and an illumination source shape configured to illuminate the patterning device pattern;
   calculating a size of a printed sidelobe generated as a result of optical transfer of the patterning device pattern onto the substrate when illuminated by the illumination source shape; and
   iteratively adjusting the patterning device pattern bias and the illumination source shape over a range of lithographic parameters until an optimization of a high latitude for the patterning device pattern and a small printed sidelobe size are obtained.

2. A method of claim 1, wherein a small printed sidelobe size corresponds to a sidelobe that is formed with a radiation intensity lower than an intensity printing threshold.

3. A method of claim 1, wherein a small printed sidelobe size corresponds to a sidelobe having a width that is smaller than a smallest distance between two features of said patterning device pattern.

4. A method of claim 1, wherein a small printed sidelobe size corresponds to a sidelobe having a width that is substantially zero.

5. A method of claim 1, wherein a small printed sidelobe size corresponds to a sidelobe having a depth lower than about 150 nm.

6. A method of claim 1, wherein a high latitude includes a depth of focus greater than about 0.3 μm.

7. A method of claim 1, wherein a high latitude includes a half range critical dimension variation of the mask pattern lower than about 20%.

8. The method of claim 1, wherein prior to calculating the size of the printed sidelobe, the method includes calculating an image of the patterning device pattern.

9. The method of claim 1, wherein the lithographic parameters include a radiation wavelength, a numerical aperture, illumination shape parameters, or any combination of the foregoing, of the lithographic apparatus.

10. The method of claim 1, comprising:
   calculating the size of the printed sidelobe for a plurality of pitches of the patterning device pattern;
   determining a pitch of the patterning device pattern giving the lowest latitude and/or highest tendency to print sidelobes, and
   determining the optimized patterning device pattern bias and the illumination source shape at the determined pitch.

11. The method of claim 1, wherein the lithographic parameters includes a radiation wavelength, a numerical aperture, an exposure dose, illumination shape parameters, or any combination of the foregoing, of the lithographic apparatus.

12. The method of claim 1, wherein calculating a size of a printed sidelobe includes calculating a depth of a printed sidelobe.

13. The method of claim 12, wherein the depth of the printed sidelobe is used to select an exposure dose or image threshold which subsequently defines the patterning device pattern bias.

14. The method of claim 1, wherein calculating the size of the printed sidelobe includes performing a resist calculation of the printed sidelobe.

15. The method of claim 1, wherein the calculation of the size of the printed sidelobe is performed by computer simulation.

16. The method of claim 15, wherein the computer simulation operates using an aerial image model, a full resist model, a lumped parameter model or a variable threshold resist model.

17. The method of claim 1, further comprising determining a process latitude in terms of dose and/or focus for the patterning device pattern and optical conditions.

18. The method of claim 17, wherein the latitude is determined using a critical dimension uniformity analysis.

19. The method of claim 1, wherein the high latitude is optimized by minimizing a target size variation.

20. The method of claim 19, wherein the target size is critical dimension.

21. The method of claim 1, wherein the lithographic parameters are determined using a simplex and/or Levenberg-Marquardt convergence routine.

22. The method of claim 1, further comprising calculating a metric that represents a variation of a lithographic response of the transferred patterning device pattern on the substrate over the range of lithographic parameters, and
   depending on a result of the metric, (a) adjusting the patterning device pattern bias and the illumination source shape and (b) calculating the metric until a substantially maximum or minimum value of the lithographic response is obtained.

23. The method of claim 22, wherein the metric is critical dimension uniformity.

24. A computer program product having machine-executable instructions, said instructions executable by a machine to perform a method for configuring the optical transfer of a patterning device pattern onto a substrate using a lithographic apparatus, the method comprising:
   selecting a patterning device pattern bias and an illumination source shape configured to illuminate the patterning device pattern;
   calculating a size of a printed sidelobe generated as a result of optical transfer of the patterning device pattern onto the substrate when illuminated by the illumination source shape; and
   iteratively adjusting the patterning device pattern bias and the illumination source shape over a range of lithographic parameters until an optimization of a high latitude for the patterning device pattern and a small printed sidelobe size are obtained.

25. The product of claim 24, wherein a small printed sidelobe size corresponds to a sidelobe that has an associated radiation intensity lower than an intensity printing threshold associated with the mask pattern.

26. The product of claim 24, wherein a small printed sidelobe size corresponds to a sidelobe having a width that is smaller than a smallest distance between two features of said patterning device pattern.

27. The product of claim 24, wherein a small printed sidelobe size corresponds to a sidelobe having a depth lower than about 150 nm.

28. The product of claim 24, wherein a high latitude includes a depth of focus greater than about 0.3 μm.

29. The product of claim 24, wherein a high latitude includes a half range critical dimension variation of the patterning device pattern lower than about 20%.

30. The product of claim 24, wherein prior to calculating the size of the printed sidelobe, the method includes calculating an image of the patterning device pattern.

31. The product of claim 24, wherein the lithographic parameters include a radiation wavelength, a numerical aperture, illumination shape parameters, or any combination of the foregoing, of the lithographic apparatus.

32. The product of claim 24, wherein the method comprises:
calculating the size of the printed sidelobe for a plurality of pitches of the patterning device pattern;
determining a pitch of the patterning device pattern giving the lowest latitude and/or highest sidelobe depth, and
determining the optimized patterning device pattern bias and the illumination source shape at the determined pitch.

33. The product of claim 24, wherein the lithographic parameters includes a radiation wavelength, a numerical aperture, an exposure dose, illumination shape parameters, or any combination of the foregoing, of the lithographic apparatus.

34. The product of claim 24, wherein calculating a size of a printed sidelobe includes calculating a depth of a printed sidelobe.

35. The product of claim 24, wherein calculating the size of the printed sidelobe includes performing a resist calculation of the printed sidelobe.

36. The product of claim 24, wherein calculation of the size of the printed sidelobe is performed by computer simulation.

37. The product of claim 24, wherein the computer simulation operates using an aerial image model, a full resist model, a lumped parameter model or a variable threshold resist model.

38. The product of claim 24, wherein the method further comprises determining the latitude for the patterning device pattern.

39. The product of claim 24, wherein the latitude is determined using a critical dimension uniformity analysis.

40. The product of claim 24, wherein the lithographic parameters are determined using a simplex and/or Levenberg-Marquardt convergence routine.

41. The product of claim 24, wherein the method further comprises calculating a metric that represents a variation of a lithographic response of the transferred patterning device pattern on the substrate over the range of lithographic parameters, and
depending on a result of the metric, (a) adjusting the patterning device pattern bias and the illumination source shape and (b) calculating the metric until a substantially maximum or minimum value of the lithographic response is obtained.

42. The product of claim 41, wherein the metric is critical dimension uniformity.

43. A lithographic projection apparatus, comprising:
a support structure configured to support a patterning device which can be used to pattern a beam of radiation according to a desired pattern;
a substrate table configured to hold a substrate;
a projection system configured to project the patterned beam onto a target portion of the substrate;
a processor configured to select a patterning device pattern bias and an illumination source shape configured to illuminate the patterning device pattern, calculate a size of a printed sidelobe generated as a result of optical transfer of the patterning device pattern onto the substrate when illuminated by the illumination source shape, and iteratively adjust the patterning device pattern bias and the illumination source shape over a range of lithographic parameters until an optimization of a high latitude for the patterning device pattern and a small printed sidelobe size are obtained; and
a selectably variable beam controller that is adapted to modify a cross-sectional intensity distribution in the beam of radiation, before the beam of radiation reaches the patterning device, in accordance with the illumination source shape determined by the processor.

* * * * *